United States Patent [19]
Koscica et al.

[11] Patent Number: 5,323,030
[45] Date of Patent: Jun. 21, 1994

[54] FIELD EFFECT REAL SPACE TRANSISTOR

[75] Inventors: Thomas E. Koscica, Clark; Jian H. Zhao, North Brunswick, both of N.J.

[73] Assignee: The United States of America as represented by the Secretary of the Army, Washington, D.C.

[21] Appl. No.: 126,837

[22] Filed: Sep. 24, 1993

[51] Int. Cl.$^5$ .................. H01L 29/161; H01L 29/205
[52] U.S. Cl. .................................. 257/195; 257/273; 257/194
[58] Field of Search .................. 257/24, 27, 184, 185, 257/191, 192, 280, 286, 194, 195, 273

[56] References Cited

U.S. PATENT DOCUMENTS

| 5,111,255 | 5/1992 | Kiely et al. | 257/24 |
| 5,157,467 | 10/1992 | Fujii | 257/24 |
| 5,223,724 | 6/1993 | Green, Jr. | 257/24 |

OTHER PUBLICATIONS

Luryi et al, "Charge Injection Transistor Based on Real-Space Hot-Electron Transfer", IEEE Transactions on Electron Devices, vol. ED-31, No. 6, Jun. 1984.

Primary Examiner—Jerome Jackson
Assistant Examiner—Nathan K. Kelley
Attorney, Agent, or Firm—Michael Zelenka; William H. Anderson

[57] ABSTRACT

The present Field Effect Real Space Transistor, or FERST, is a four terminal device with S, G, C, and D representing the source, gate, collector, and drain, respectively. The S, G, and D terminals can be likened to those of the MODFET. The collector name is borrowed from other real space transfer devices. Surrounding the entire device is an oxygen implant isolation. The source and drain ohmic contacts penetrate to the 150 Å GaAs channel while the collector ohmic contact does not penetrate due to its position upon an elevated submesa. AlGaAs layers are used as etch stops during processing of the device and a Schottky barrier gate is placed on an undoped layer. Channel carriers are provided by modulation doping the lower barrier of the channel. An Al$_{0.35}$Ga$_{0.65}$As layer on the upper channel side is used as a real space transfer barrier. In operation and under appropriate bias conditions, real space transfer occurs across this upper barrier and into the collector. Voltage is applied to the device between the drain and source which heats up electrons in the channel to an energized state. Field effect control by the gate then adjusts the voltage distribution throughout the device due to both ohmic voltage drops and the variation in channel conductance under the gate.

8 Claims, 11 Drawing Sheets

FIELD EFFECT REAL SPACE TRANSISTOR

GOVERNMENT INTEREST

The invention described herein may be made, sold, used and licensed by, or on behalf of, the Government of the United States of America without the payment to me of any royalties thereon.

FIELD OF THE INVENTION

The present invention relates to field effect transistors utilizing real space transfer.

BACKGROUND OF THE INVENTION

Heretofore, solid-state devices have been grouped into three categories based on commonality of their physical operation. These three categories are: 1) the "potential effect" in which the adjustment of barrier height controls operation; 2) the "field effect" in which variation of a depletion region controls the operation; and 3) the "real space transfer effect" in which carriers are energized, or heated, and transferred over a physical barrier. The common bipolar junction transistor, BJT, and field effect transistor, FET, are common examples of potential effect and field effect device types, respectively.

These types of heterostructure semiconductor devices have enjoyed considerable interest in the last several years as candidates for high-speed switches and for transistors that can generate and amplify high frequency electronic signals. One class of these devices (real space transfer) operates on the principle of transfer of hot electrons between two different semiconductor layers separated by a potential barrier, where the temperature of the electrons is controlled by an applied electric field. Because the temperature of these electrons responds very rapidly to the applied field, and because the transit time of these electrons can be very short, such devices offer the promise of very high frequency operation.

These heterostructure devices have evolved from the well-known Gunn diode, which is a monolithic semiconductor structure that also employs a "transferred electron" mechanism. In the Gunn diode, a semiconductor material has a filled valence band and a partially filled conduction band. This conduction band has a central minimum-energy valley of electron states that are occupied up to the Fermi level, and one or more "satellite-valleys" at higher energies that are normally unoccupied. An example of such a material that is used in these devices is GaAs, in which the satellite valley minimum is 360 meV above the central valley minimum. If the GaAs is subjected to an electric field sufficiently large to give some of the conduction electrons more energy than this energy gap, they can be transferred into, and remain in, the satellite valley. Being in a different region of quasi-momentum space (or "k-space"), these satellite valley electrons have a different effective mass, which in GaAs is about 20 times higher than that in the central valley. The corresponding electron mobility is much smaller than that of the central valley electron states. The conductivity of the electrons is therefore reduced by the field, and the material exhibits a negative differential resistance. Semiconductor materials exhibiting such nonlinear behavior can be used to construct electronic oscillators, amplifiers, and switching and storage devices.

The heterostructure devices that are related to the present invention comprise adjacent layers of different semiconductor materials in which the conduction bands of the materials have different mobilities. Instead of transferring electrons into lower mobility states in k-space, the applied electric field causes the conduction electrons in a high-mobility material to become heated and transferred in "real space" into an adjacent material of lower mobility. This means, again, that the conductivity of these electrons is effectively reduced by the applied field, and these heterostructures also exhibit negative differential resistance.

Negative resistance heterostructures have been disclosed in U.S. Pat. No. 4,257,055 (Hess et al.), and are described also in the following articles: "Negative Differential Resistance Through Real-Space Electron Transfer", K. Hess, H. Morkoc, H. Shichijo and B. G. Streetman, *Appl. Phys. Lett.* 35 (6), Sep. 15, 1979; "Measurements of Hot-Electron Conduction and Real-Space Transfer in GaAs-Al$_x$Ga$_{1-x}$ Heterojunction Layers", M. Keever, H. Shichijo, K. Hess, S. Banerjee, L. Witkowski, H. Morkoc, and B. G. Streetman, *Appl. Phys. Lett.* 38 (1), Jan. 1, 1981; "Fast Switching and Storage in GaAsAl$_x$Ga$_{1-x}$ Heterojunction Layers", M. Keever, K. Hess and M. Ludowise, *IEEE Electron Device Letters*, Vol. EDL-3, No. 10, October 1982. These references all describe semiconductor heterostructures having adjacent alternate layers of high-mobility GaAs and low-mobility Al$_x$Ga$_{1-x}$As. Conduction electrons are supplied by donors in the Al$_x$Ga$_{1-x}$As and migrate to the GaAs layer, which has a smaller band gap and lower scattering. When an electric field is applied in a direction parallel to the interface between the layers, the electrons in the conduction band of the GaAs will be rapidly heated to energies well above their thermal equilibrium value, and acquire sufficient energy to overcome the conduction band discontinuity between the two materials and move back into the Al$_x$Ga$_{1-x}$As layer. This propagation can be described as a kind of thermionic emission. Once these electrons reach the low-mobility layer, their conductivity is reduced and the heterostructure displays the negative differential resistance described above.

The above references describe the basic principles of real space electron transfer and their application to switching and storage devices. These principles are well understood for the most part, although some of the details have yet to be elucidated, such as the precise physical location at which the electrons transfer. Interest has been growing in the application of these principles in order to design transistors that can amplify and generate high frequency signals.

Figure 1:
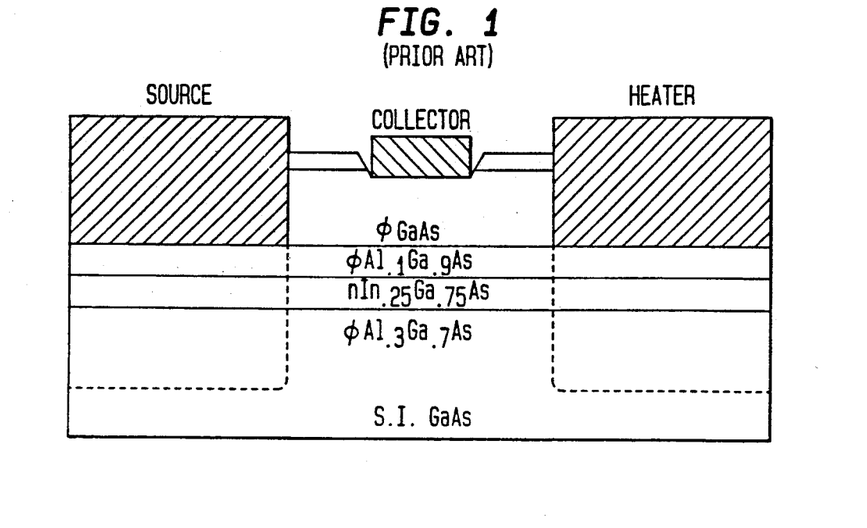
FIG. 1 is a cross-section illustration of a prior art real space transfer transistor.
Figure 2:
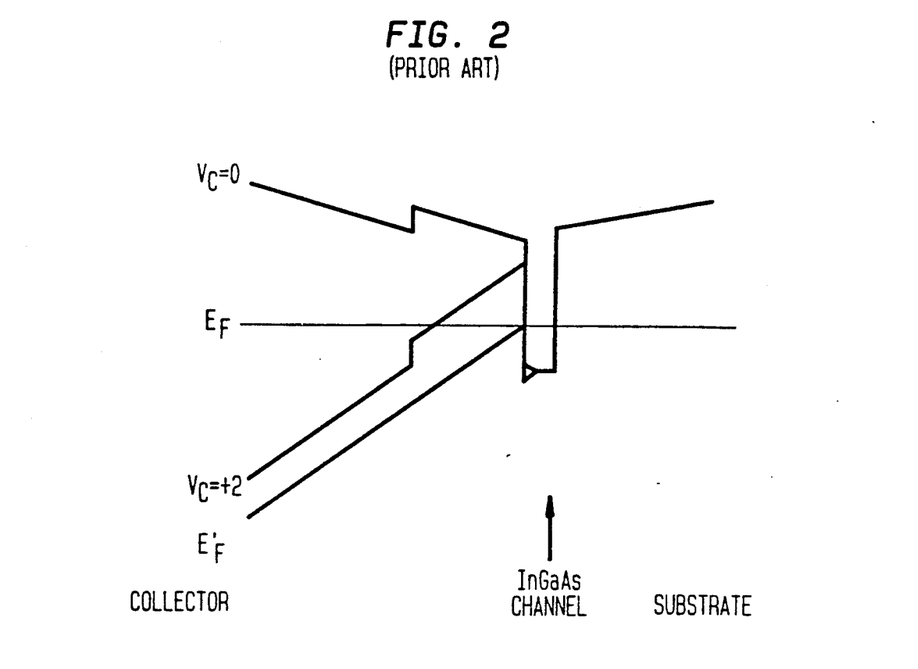
FIG. 2 is a band diagram of the real space transfer transistor illustrated in FIG. 1.

One transistor design based on these principles is described in the article "Charge Injection Transistor Based on Real-Space Hot-Electron Transfer", S. Luryi, A. Katalsky, A. Gossard and R. Hendel, *IEEE Transactions on Electron Devices*, Vol. ED-31, No. 6, June 1984. This reference describes a transistor having a conducting n-GaAs substrate that acts as the collector of the device. Over this substrate, an undoped Al$_x$Ga$_{1-x}$As barrier layer is grown, then an undoped GaAs channel layer, and a layer of n-Al$_{0.34}$Ga$_{0.66}$As which provides a source of electrons capped by an n-GaAs layer. A source electrode (serving as the "emitter") and a drain electrode ("base") extend downward through the top three layers into, but not through, the barrier layer. A gate electrode is also provided, redefined in the charge injection transistor as a collector due to the large currents which flow making it unlike traditional field effect controlled gates. This gate allows the device to function in a negative resistance field effect transistor mode (NERFET), as well as a charge injection transistor mode (CHINT). A variation to the original structure which placed the collector on the top side is shown in FIG. 1 with the corresponding band diagram for this device being shown in FIG. 2. This design has inherently less parasitic capacitance and a demonstrated fmax=18 GHz and fT=60 GHz.

In the CHINT mode of operation with a common base (drain) configuration, positive voltages (with respect to the drain) are applied to the source and collector electrodes. The source-drain field causes an electron flow in the channel layer and raises the temperature of these electrons. They are normally confined to the channel layer, until the temperature becomes sufficiently high that they can overcome the barrier layer. The hot electrons are thereby injected by thermionic emission into the barrier layer region and drift to the substrate collector. As the drain voltage increases, the drain current initially rises, and then decreases as the electron temperature exceeds the barrier height and the collector current rises.

The transistor structure described in this Luryi reference has several limitations, however. One problem arises from parasitic leakage, i.e. direct injection of electrons from the source electrode into the collector. Another limitation arises from the delay time caused by the electron time of flight in the channel and barrier. A third limitation arises from the large capacitance between the substrate collector and the source (or drain). A fourth limitation is the low current gain ratio between the input control and output terminals. All of these limitations adversely affect the high frequency performance of this device. An improved version of this transistor structure is described in the article "High-Frequency Amplification and Generation in Charge Injection Devices", A. Katalsky, J. H. Abeles, R. Bhat, W. K. Chan, and M. A. Koza, *Appl. Phys. Lett.* 48 (1), Jan. 6, 1986. These references report measurements on CHINT devices indicating power gain up to 9.8 GHz and extrapolated current gain up to 29 GHz. These appear to be the upper frequency limits for CHINT devices attained to date.

Due to these limitations, the real space transfer effect has been the least utilized method of operation in solid state devices. For example, in the area of applications, a digital "NORAND" structure was built using real space transfer devices, S. Luryi, P. M. Mensz, M. R. Pinto, P. A. Garbinski, A. Y. Cho, and D. L. Sivco, "Charge Injection Logic," *Appl. Phys. Lett.*, vol. 57, pp. 1787-1789, October 1990. Although conceptually interesting as an attempt to achieve higher functional density, the circuit only had a fanout of one, which, as those skilled in the art will realize, is not very useful for practical circuits. For analog circuits, an A.C. power gain of 20 dB has been demonstrated at 1 GHz; this performance, however, is mediocre when compared with other available FET devices. An oscillator circuit was fabricated using the real space transfer device, described above as a NERFET; however, no unique performance or application was achieved with this device.

Accordingly, real space transfer has remained under utilized for beneficial applications. Although a few application ideas have been demonstrated, their competitiveness with other devices is limited by their maximum demonstrated d.c. current gain of approximately 1.1. Therefore, real space transfer device research has not had success in trying to incorporate this physics into the conventional transistor structure as previous research has sought to do.

SUMMARY OF THE INVENTION

Accordingly, one object of the present invention is to provide for a practical solid state device which uses real space transfer as its mode of operation.

Another object of the invention is to provide for such a device which separates the function of heater current supply from the function of setting the channel voltage.

A third object of the invention is to provide an improved current transfer ratio between output and input leading to higher fan out capability.

Still another object of the invention is to provide for such a device which is compatible with established MODFET processing.

The present invention, which will occasionally be referred to as a Field Effect Real Space Transistor, or FERST, is a four terminal device with a source, gate, collector, and drain, represented by S, G, C, and D respectively. The S, G, and D terminals can be likened to those of a modulation doped field effect transistor, or MODFET. The collector name is borrowed from other real space transfer devices and, therefore, should not considered to be an exact limitation of the present invention. Surrounding the entire device is an oxygen implant isolation. The source and drain ohmic contacts penetrate down to a 150 Å GaAs channel while the collector ohmic contact does not penetrate due to its position upon an elevated submesa. AlGaAs layers are used as etch stops during processing of the device and a Schottky barrier gate is placed on an undoped self-aligned layer to allow device operation in depletion mode. Channel carriers are provided by modulation doping the lower barrier of the channel. An $Al_{0.35}Ga_{0.65}As$ barrier layer on the upper channel side is used as a real space transfer barrier.

In operation and under appropriate bias conditions, real space transfer occurs across this upper barrier and into the collector. Voltage is applied to the device between the drain and source which heats up electrons in the channel to an energized state. Field effect control by the gate then adjusts the voltage distribution throughout the device due to both ohmic voltage drops and the variation in channel conductance under the gate. The gate is not brought into a forward biased condition which allows true low current gate operation. As the voltage on the gate becomes slightly more positive, the conductance in the channel beneath the gate increases which in turn raises the amount of source to drain heating voltage dropped in the channel beneath the collector. This increased heating energizes carriers, electrons in the present case, over the barrier and into the collector and thereby away from the gate. In this way, the field effect control of the gate adjusts the heating voltage present beneath the collector which in turn redirects electrons, which enter the device at the source, from the drain toward the collector. In like manner, as the voltage signal applied to the gate is reduced, less electrons are energized to flow toward the collector and continue instead toward the drain. Since the single path of electrons from the source is redirected between two output ports, the two output ports necessarily have complementary changes in their terminal currents.

Briefly then, the gate voltage alters channel voltage increases heating beneath the collector as the gate voltage is increased and energizes electrons over the real space barrier into the collector and away from the drain.

BRIEF DESCRIPTION OF THE DRAWINGS

The present invention will be better understood in light of the Detailed Description of the Invention and the attached drawings wherein some elements of the Figures are not drawn to scale for purposes of illustration and wherein.

DETAILED DESCRIPTION OF THE INVENTION

Figure 3:
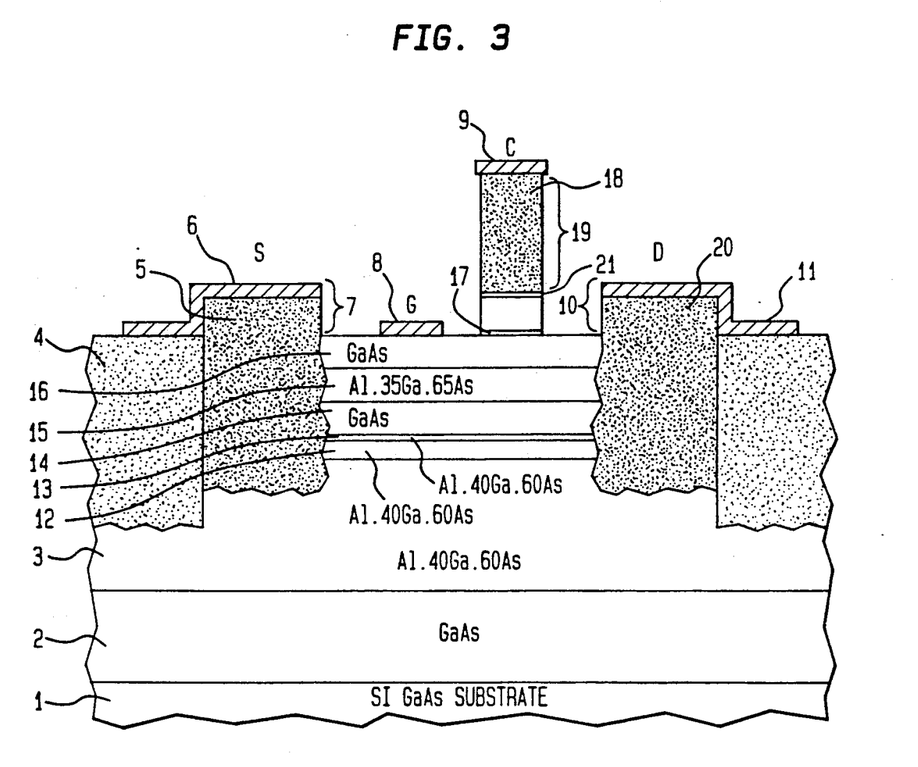
FIG. 3 is a cross-section illustration of a field effect real space transfer device according to the present invention.

Referring now to FIG. 3, there is shown the field effect real space transfer device according to the present invention. As shown, on top of the semi-insulating GaAs substrate 1, an intermediate lattice of at least two different semiconductor layers is grown, an epitaxial layer 2 which, as an example, is a 1000 Å layer of GaAs that is nominally doped to approximately $10^{14}$ cm$^{-3}$ n-type and a second layer 3 which is typically doped similar to the first layer 2, but is slightly thicker than the first, for example 1500 Å, and has a different stoichiometry such as $Al_{0.40}Ga_{0.60}As$. The next region 4 is a high resistance area created by exposing a masked wafer during the appropriate processing stage to oxygen ion implant damage. Layers 5 and 20 are alloyed ohmic contacts which penetrate down through the intermediate layers to the top of region 3. Alloyed ohmic contact 18 is prepared in a similar fashion within region 19. Metal layers 6, 9 and 11 consist of AuGeNiAgAu or any similar metal system which will form an alloyed ohmic contact formation. The layer, represented by numerals 7 and 10, consists of highly doped GaAs ($5 \times 10^{18}$ cm$^{-3}$ n-type) and is, for example, 220 Å in thickness. This highly doped layer is utilized primarily to assist in the alloyed contact formation. Metal 8 can be any composition which forms a stable Schottky barrier such as TiAu. The additional epitaxial layers grown on top of layer 3 include the following: layer 12 which is a highly doped $1 \times 10^{18}$ cm$^{-3}$ 100 Å $Al_{0.40}Ga_{0.60}As$ layer which is utilized to inject carriers into the channel 14 (commonly referred to as modulation doping); layer 13 is a 20 Å undoped buffer used to isolate carriers in the channel 14 from scattering from the highly doped barrier layer 12; channel 14 consists of a 150 Å layer of GaAs with a nominal doping of $10^{14}$ cm$^{-3}$ n-type; barrier 15, which is used as the real space transfer mechanism, consists of a 400 Å nominally doped $10^{14}$ cm$^{-3}$ n-type layer of composition $Al_{0.35}Ga_{0.65}As$; epitaxial layer 16 is a 100 Å nominally doped $10^{14}$ cm$^{-3}$ n-type GaAs layer; and layers 17 and 21 are 20 Å undoped $Al_{0.40}Ga_{0.60}As$, which are used as etch stop layers which allow accurate sizing of the top wet etched layers.

An example of a method of fabricating the present invention is a four mask process which includes the general steps of forming a collector sub-mesa via self aligned etch; forming the source and drain ohmic contacts; isolating the device; and finalizing the metal contacts for device pads. To insure good control over the wet etching process, two AlGaAs etch stop layers are used. These layers relax the etching requirements for the submesa and cap layers. Moreover, this four mask process uses all self-aligned wet etching to achieve a tri-height device having both ohmic and Schottky contacts. For accurate layer fabrication, adjustment must be made for the difference between the molecular beam epitaxy (MBE) physically grown doping and the actual active doping. Doping levels presented in this method are for active doping and physical layer MBE layer growth is a factor of two higher in each layer as a means of compensation.

Figure 9A:
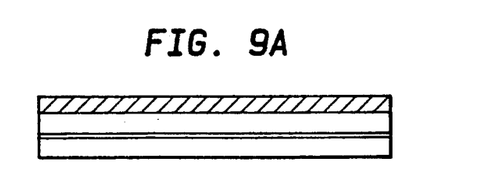
FIGS. 9a-r illustrate one method of fabricating the field effect real space transfer device according to the present invention.
Figure 9B:
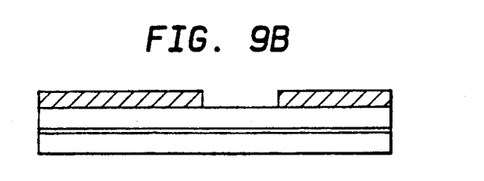
Figure 9C:
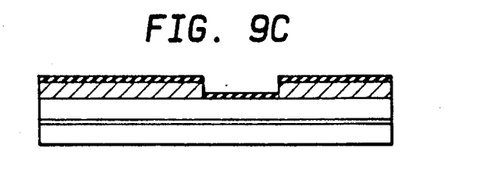
Figure 9D:
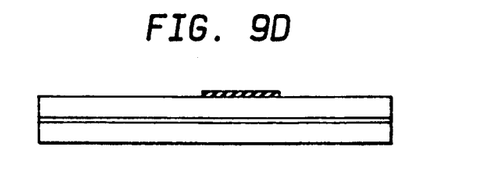
Figure 9E:
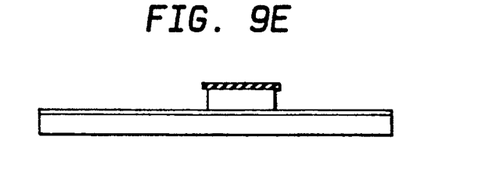
Figure 9F:
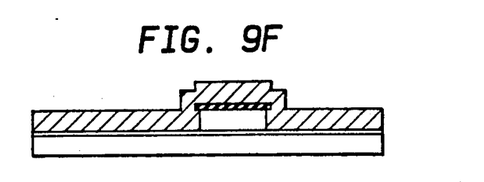
Figure 9G:
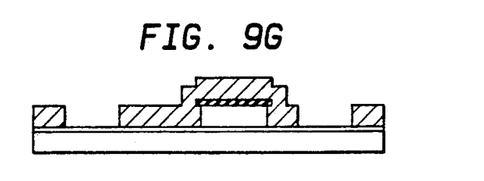
Figure 9H:
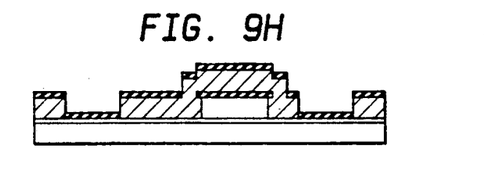
Figure 9I:
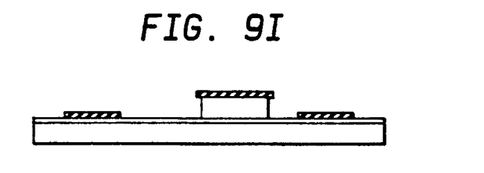
Figure 9J:
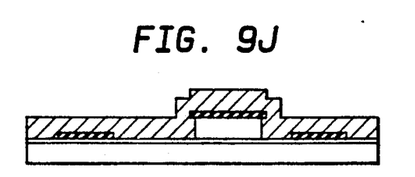
Figure 9K:
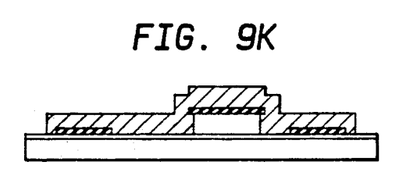
Figure 9L:
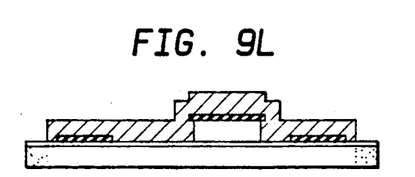
Figure 9M:
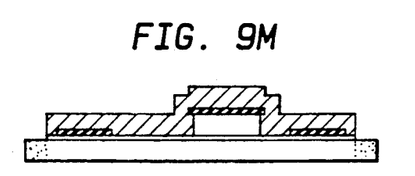
Figure 9N:
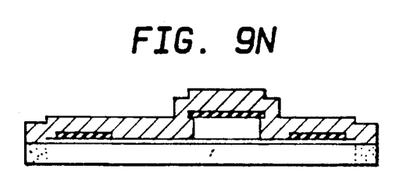
Figure 9O:
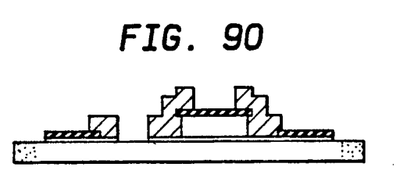
Figure 9P:
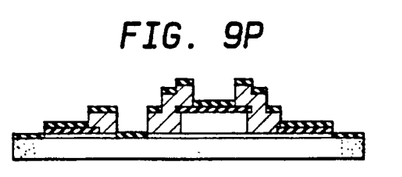
Figure 9Q:
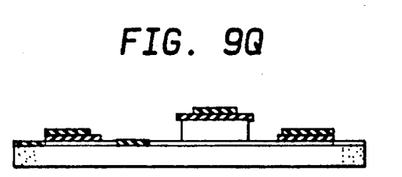
Figure 9R:
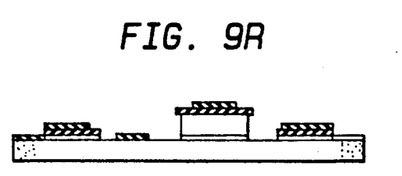

Specifically and as shown in FIGS. 9a-e, a resist coat is formed over layers 1-3, 12-18 and 21 of FIG. 3 (FIG. 9a). These layers are formed by epitaxy techniques, such as molecular beam epitaxy, all of which are well known to those skilled in the art. A submesa mask for the collector is then formed and developed by exposing a portion of the InGaAs stop layer 21 (FIG. 9b). An ohmic metal is evaporated over the exposed area and resist coat; the ohmic metal on the resist is then lifted off to form contact 9 (FIG. 9c and 9d). A self-aligned isotropic etch is performed to the AlGaAs stop layer 17 and the remaining AlGaAs is removed (FIG. 9e). Thereafter, another resist coat is formed over the device (FIG. 9f); an ohmic contact mask is laid over the device and developed (FIG. 9g); and the ohmic metal is then evaporated and lifted off to form the source and drain contacts (FIGS. 9h and 9i). The isolation for the device is accomplished by applying another resist coating; masking the device and then developing the mask around the device at the isolation areas (FIGS. 9j and 9k). The device is exposed to oxygen ion implant damage to isolate the device (9l). Next, the GaAs cap is etched off to the AlGaAs stop layer with a self-aligned etch procedure; and then, the AlGaAs layer is etched off over the isolation area (9m). To finalize the device, the final metal for the device pads is formed (9n-9r). First, a final resist coat is formed on the device (9n) and then, the final metal mask for the gate Schottky and the source, gate, collector, and drain pads is formed over the resist coat and developed (9o). A selective etch recesses the gate areas to allow metal of the next step to contact the undoped GaAs layer 16 of FIG. 3. TiAu is evaporated over the mask and lifted off (9p and 9q). Lastly, the doped GaAs cap is etched off from exposed areas with a selective etch for GaAs to the AlGaAs stop layer; the remaining AlGaAs stop layer is then etched off (9r).

Figure 4A:
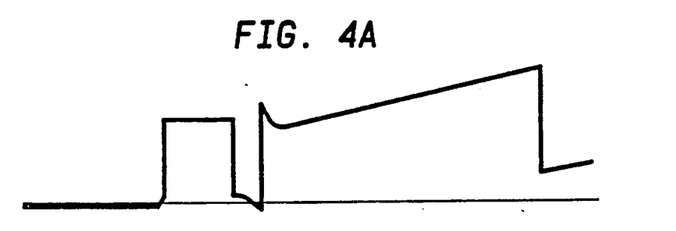
FIGS. 4a-c are band diagrams of the device illustrated in FIG. 3 from collector to channel for the following biasing conditions: unbiased (4a); negative collector bias (4b); and positive collector bias (4c).
Figure 4B:
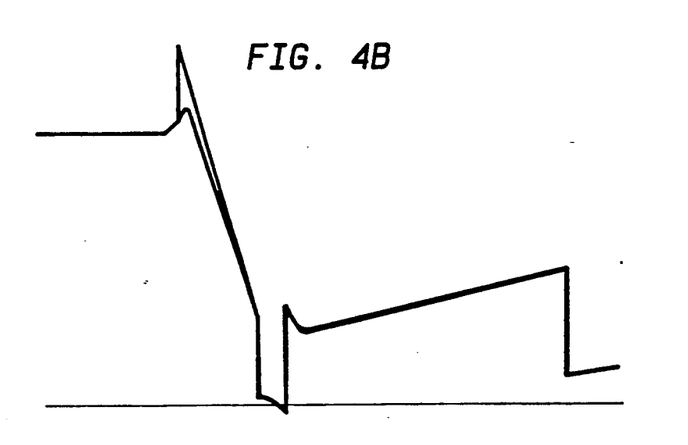
Figure 4C:
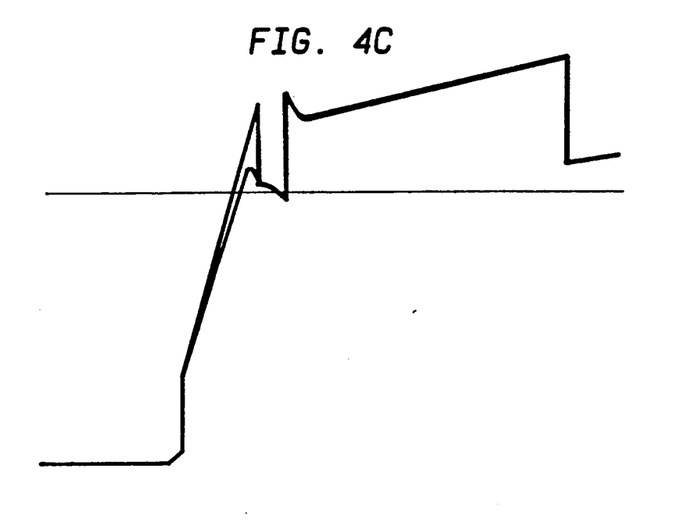

Now referring to FIGS. 4a–c and 5a–c and as those skilled in the art will readily recognize, consideration of the barrier's height under different bias conditions is of particular importance to the designs parameters of the present invention. FIGS. 4a–c show the one dimensional band diagram along the channel to collector direction obtained using a Poisson solver under three biasing conditions, unbiased, and negative and positive collector bias, respectively. When the channel and collector are at the same potential, the unbiased case of FIG. 4a, the barrier seen by hot electrons in the channel is essentially equal to $\Delta E_c$, the conduction band discontinuity if the small channel ground state energy is neglected. Note that when a negative relative potential is applied to the collector, FIG. 4b, channel electrons face an increased barrier which inhibits escape. Alternately, when a positive relative potential is applied to the collector, FIG. 4c, the electric field across the barrier induces an image force energy lowering. This effect can be modeled to the first order by the Schottky image force potential:

$$\Delta\phi = \sqrt{qE/4\pi\epsilon_0}$$

where $E = V/t =$ the electric field across the barrier of thickness, t. Thus the thermionic current equation becomes:

$$J = J_s(e^{V/V_T} - 1)$$

$$J_s = A^*T^2 e^{-\phi B/VT} = A^*T^2 e^{-(\Delta E_c - \Delta\phi)/VT}$$

where $V_T = kT/q$, $A^*$ is a Richardson constant and $\Delta E_c$ is the flat band barrier height. The magnitude of $\Delta\phi$ becomes significant only at high field strengths. Image force lowering makes it easier for hot electrons to reach the collector as compared with the unbiased case of FIG. 4a. Furthermore, not that any carrier that crosses the barrier is actively collected by the positively biased collector. Therefore, according to the present invention, device operation uses biasing that varies between FIG. 4c and 4a. The bias state in FIG. 4b is not used because reverse image force lowering would inject carriers into the channel.

Figure 5A:
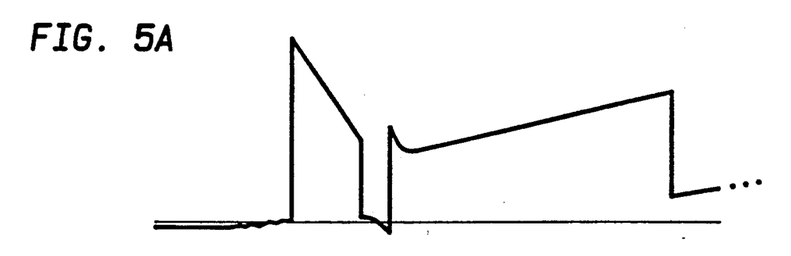
FIGS. 5a-c are band diagrams of the device illustrated in FIG. 3 from gate to channel for the following biasing conditions: unbiased (5a); reverse bias (5b); and forward bias (5c).
Figure 5B:
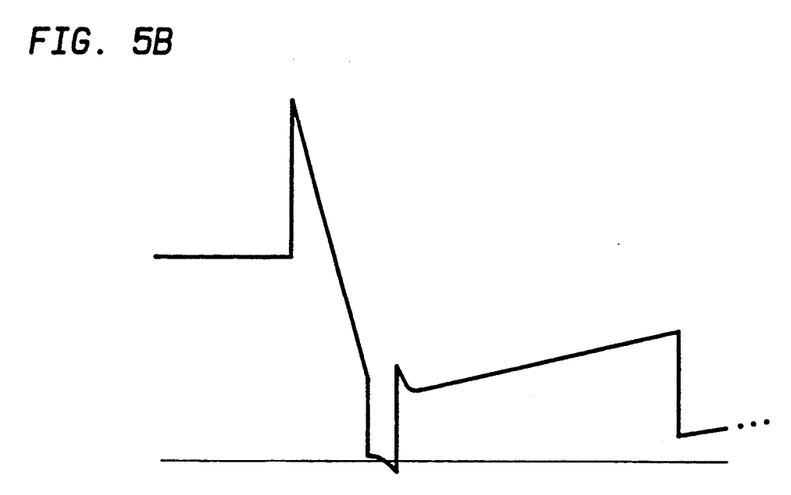
Figure 5C:
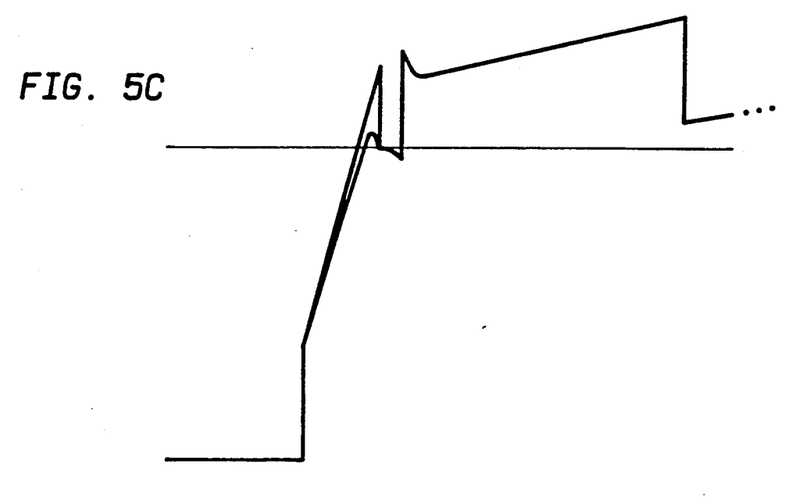

Now considering the barrier between the gate Schottky and the channel, FIG. 5a–c show the three cases of the gate unbiased, negatively biased, and positively biased with respect to the channel. In the unbiased case, FIG. 5a, the Schottky barrier is larger than $\Delta E_c$ and thus, repels hot electrons from reaching the gate. Adding negative bias, FIG. 5b, increases the repulsion barrier and conversely, a positive bias reduces the Schottky barrier to below the $\Delta E_c$ barrier such that hot carriers would only be blocked by the $\Delta E_c$ barrier. To maintain proper gate operation, bias can be slightly positive, or slightly positive, but it must not become so positive as to cause a forward bias condition on the gate.

Figure 6:
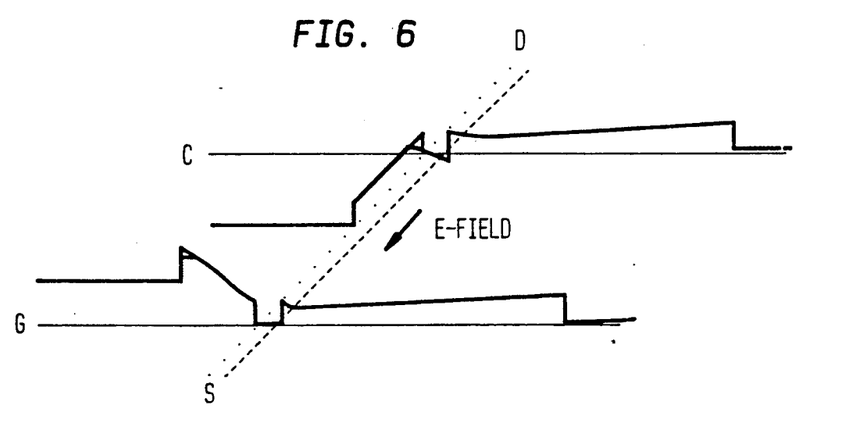
FIG. 6 is a band diagram for the present invention under bias.

FIG. 6 represents an integrated band diagram to show biasing in the present invention. Note that the reverse biased Schottky gate is a hot electron barrier as is the backside AlGaAs layer. At the collector, image force lowering reduces the barrier, thus enhancing hot electron collection. The gate voltage controls channel conductance which in turn adjusts the heating voltage drop, or field, beneath the collector. As real space transfer occurs into the collector, the carrier depletion of the channel between the collector and drain increases its resistance, thus further lowering the channel voltage and increasing the collector current. (Note this positive feedback mechanism may be the origin of the steep drops and further, note that by using an ohmic contact at the collector, all the collector to channel potential difference appears across the barrier.)

Since the collector and drain terminals can have either forward or reverse relative polarity during operation, they need to be electrically isolated. To maintain independence between the collector and drain, an undoped surface layer is used to prevent direct conduction.

The choice of thickness of the real space transfer barrier is a balance among several requirements. Preferably, the barrier should be over 50 Å to minimize the probability of direct tunneling. Next, the maximum voltage difference possible between collector and channel is the sum of ohmic drops plus the maximum potential across the real space transfer barrier = (maximum electric field)(barrier thickness) = $(2.5 \times 10^7$ V/m)(barrier thickness). A third constraint on the barrier thickness is that the source and drain ohmic contacts should alloy through to the channel below without excessive resistance. The choice of a 400 Å barrier in the present FERST is a balance between these requirements.

The following criteria are relevant to channel design. Low doping of the channel increases the mean free path and in turn the carrier heating achievable under bias. Toward this end, modulation doping including an undoped buffer layer is advantageous. The channel carriers are also prone to k-space transfer, also known as the Gunn effect, since valley separation is 0.3 eV for GaAs. Heated electrons can transfer into the energized k-space mode in the channel and then have a minimum barrier to real space transfer. This k-space transfer does slow device speed since electrons in the energized mode have lower mobility in GaAs. Accordingly, an alternate device design to suppress k-space transfer and the Gunn effect domains that may occur would be to use a channel material such as InGaAs with a higher k-space valley separation.

The cap layer must have doping that is high enough and its thickness low enough to permit a good alloyed ohmic contact to the channel.

The predicted requirement of the drain to source voltage required for electron heating can be estimated from that of other real space transfer devices. The extremes range from 0.5 V/$\mu$m to 4 V/$\mu$m depending on ohmic resistance and channel doping. Due to the design differences of the present invention, and the wide reported spread, the 10 $\mu$m channel length should have an operating $V_{SD}$ somewhere in the range 5–40 V.

The use of implant isolation rather than MESA isolation is to meet the concurrent engineering design principle of integrated circuit compatibility. Multienergy oxygen implants will be used in the range 25–180 keV to achieve device isolation. Etched MESA isolation can be used, however, if planarity is not sought in design choice.

Figure 7A:
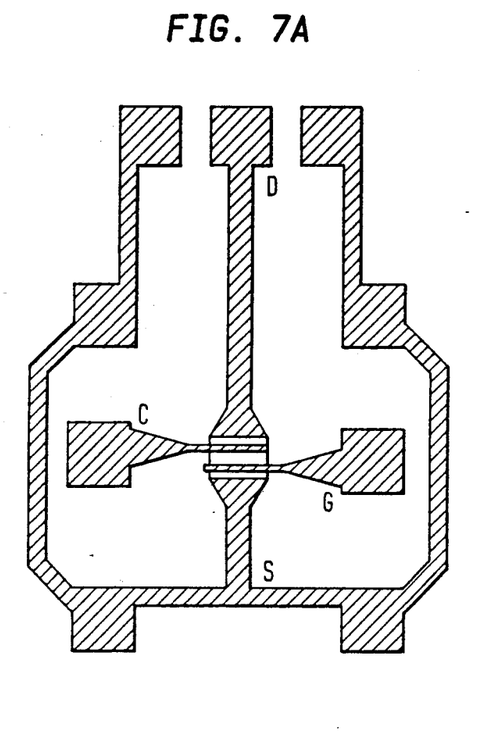
FIGS. 7a and 7b are top view illustrations of two metallization configurations: prober ready (7a); and point contact with wire bond (7b)
Figure 7B:
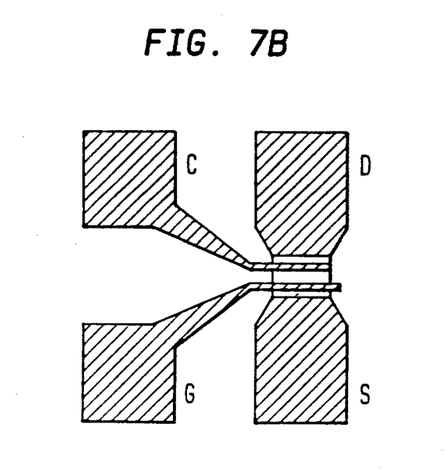
Figure 8:
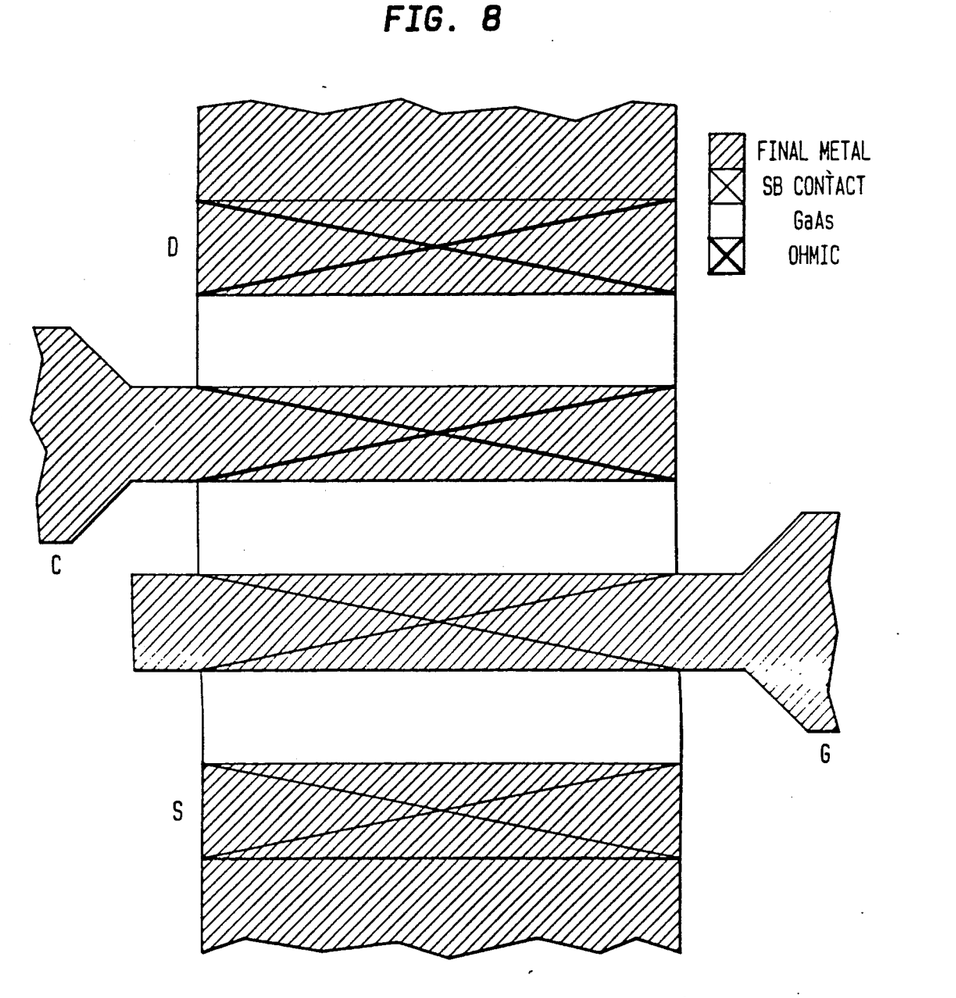
FIG. 8 is a top view of a top metallization configurations showing the location of contacts for the present invention.

The interconnect metal used on the device can be seen in FIGS. 7a and 7b with detail in FIG. 8. Note that in order to get the metal to ramp up to the submesa, the device needs to be appropriately aligned with respect to the wafer. FIGS. 7a-b show how the device is to be connected to external coplanar probes (FIG. 7a) or to either point probes or wire bonds (FIG. 7b).

Figure 10A:
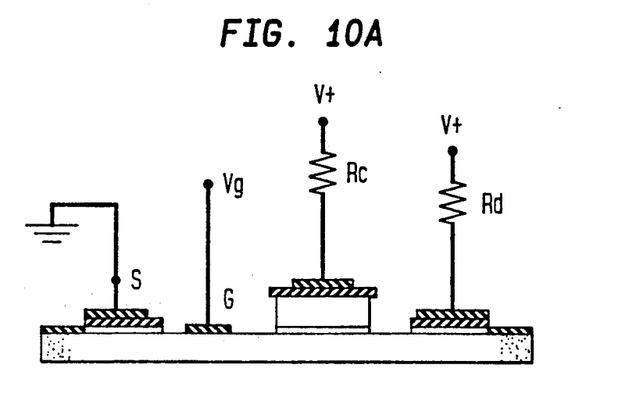
FIGS. 10a and 10b are schematic drawings of a circuit hookup to the field effect real space transfer device according to the present invention: 10a shows the device in cross-section and 10b shows the device as symbols.
Figure 10B:
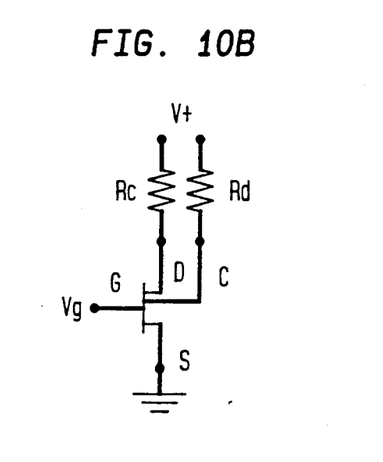

The bias arrangement for circuit operation is shown in both device and symbolic form in FIGS. 10a and 10b. Signal input is at the gate and output voltages are taken from the drain and collector circuit nodes.

Figure 11:
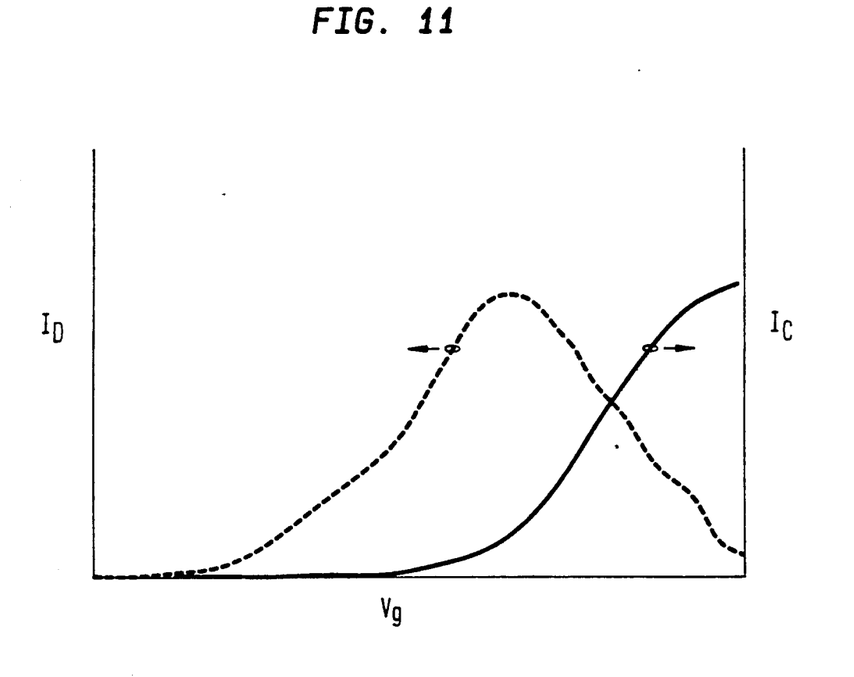
FIG. 11 is a I-V graph representative of the device shown in FIG. 3.

Referring now to various applications of the present invention, the first application considered is a frequency doubler. The device is DC biased to operate at the current peak of the Id verse Vg curve, qualitatively sketched in FIG. 11. Then by modulating an AC signal onto the gate, the Id current is reduced in each half cycle excursion of the input. This folding is nonlinear and will produce second and higher harmonics. The harmonic mix generated depends on the exact shape of the Id device curve, but will contain dominantly even modes. Note that the collector terminal is not used for output in this application although its presence is necessary for generating the steep nonlinearity in the drain. For increased device functional utilization, it would be best to find applications which can utilize both the drain and collector terminals simultaneously for outputs.

Toward this end, standard available logic circuits are converging, in that there are typically fewer outputs than inputs, for example, the AND, OR, NAND, NOR, and XOR gates, with the simple inverter being an exception. These are the building blocks of more complex design. With FETs or BJTS, this set of building block logic gates is a natural one.

By using the present invention, the set of building block logic circuits is expanded beyond the conventional set. Consider the digital circuit block obtained by biasing the FERST in FIG. 11 such that the gate voltage only causes operation to move between the peak Ic and Id points. The result is a single input logic gate with complementary outputs which is a diverging logic element fundamentally different from a simple inverter using a single FET or BJT device. It adds two additional fundamental logic gates to the traditional set. These include the "ORNOR", and the "ANDNAND". By this terminology, it is meant that outputs from the OR and NOR functions, and the AND and NAND functions, respectively, are available from a single logic state using additional series or split gates on the basic FERST device. To achieve this with conventional FETs would require an additional inverter stage with associated interconnects; that is, the conventional approach would require more components.

The value of adding the "ORNOR" and "ANDNAND" functions is made clear when digital functions that are one level higher in application complexity are considered. The present invention is, therefore, inherently a one to two line decoder in a single device. Obviously, larger decoders and the circuits which utilize decoders, including multiplexers and demultiplexers, would be further reduced in size using the present invention.

In another application area, there would be reduced circuitry needed for the implementation of state diagrams. Even though one skilled in the art would not normally need complementary outputs and since the present invention is intended to be process compatible with MODFET devices, one skilled in the art would, in principle, use each as needed.

A main benefit of the present invention, from the digital application point of view, is the intended process compatibility with MODFET technology. An estimate of the benefit of implementing a mixed FERST/MODFET digital IC technology is up to 30% reduction in component count and associated interconnects, depending on the overall IC digital function being implemented, as compared with using MODFET technology without the FERST option.

Accordingly, the present invention has potential in several unique applications particularly for digital integrated circuits. Therefore and although the present invention has been described in relation to a particular embodiment thereof, many other variations and modification and other uses will become apparent to those skilled in the art. It is preferred, therefore, that the present invention be limited not by the specific disclosure herein but only by the appended claims.

What is claimed is:

1. A semiconductor heterostructure device comprising:
   a channel region of high electrical conductance, the channel region comprising a modulation doped region and having at least two ends;
   first and second low resistance ohmic contacts disposed at either end of the channel respectively, the first and second ohmic contacts penetrating the device from a top side of the device through to the channel region;
   a barrier region disposed directly above the channel region, the barrier region having at least two ends which are in juxtaposition with the ends of the channel region, the barrier region having such dimensions and composition that the barrier acts as a real space transfer media under a predetermined bias;
   a third low resistance ohmic contact disposed between the first and second ohmic contacts on a surface of the device;
   a metal contact of Schottky type metal disposed between the first and third ohmic contacts on the surface of the device; and
   biasing means connected to the device to create a voltage drop throughout the channel region.

2. The semiconductor device of claim 1 wherein the metal contact is a dual gate.

3. The semiconductor device of claim 1 further comprising a highly doped semiconductor layer between the third ohmic contact and the surface of the device.

4. A semiconductor heterostructure device comprising:
   a channel region of high conductance comprised of a resistive modulation doped barrier layer disposed on an undoped buffer layer and a channel layer disposed on the buffer layer, the channel layer being doped low enough so as to increase a mean free carrier path and a carrier heating under bias;
   a barrier region disposed on the channel region, the barrier region having dimensions and a composition such that the barrier region acts as a real space transfer media under bias;
   a source alloyed ohmic contact penetrating the device through the channel region;
   a drain alloyed ohmic contact penetrating the device through the channel region;
   a gate contact disposed over the barrier region between the source and drain ohmic contacts;
   a collector ohmic contact disposed over the barrier between the gate and drain ohmic contacts; and voltage bias means connected to the device such that when biased real space transfer occurs across the barrier region and into the collector and such that voltage applied to the device between the drain and source heats up electrons in the channel to an energized state, whereby a field effect controlled by the gate adjusts the voltage distribution throughout the device due to ohmic voltage drops and a variation in channel conductance under the gate.

5. The heterostructure semiconductor device of claim 1 further comprising:
an intermediate lattice comprised of at least upper and lower semiconductor layers having different band gaps, the intermediate lattice being disposed on under the channel region;
a substrate disposed under the intermediate lattice;
an isolation region surrounding the device and penetrating the device down through a portion of the upper layer of the intermediate lattice; and
wherein the source and drain ohmic contacts penetrate through the device down through a portion of the upper layer of the intermediate lattice.

6. The heterostructure semiconductor device of claim 2 wherein the substrate is formed of GaAS; the intermediate lattice is formed of a 1000Å GaAs layer that is nominally doped to approximately $10^{14}$ cm$^{-3}$ n-type and a 1500Å Al$_{0.40}$Ga$_{0.60}$As layer that is nominally doped to approximately $10^{14}$ cm$^{-3}$ n-type; the modulation doped layer is highly doped $10^{18}$ cm$^{-3}$ 100Å Al$_{0.40}$Ga$_{0.60}$As layer; the channel layer is nominally n doped 150Å GaAs layer; the barrier layer is nominally n doped 400Å Al$_{0.35}$Ga$_{0.65}$As layer.

7. A single input logic gate comprising:
a channel region of high electrical conductance, the channel region comprising a modulation doped region and having at least two ends;
first and second low resistance ohmic contacts disposed at either end of the channel respectively, the first and second ohmic contacts penetrating the device from a top side of the device through to the channel region;
a barrier region disposed directly above the channel region, the barrier region having at least two ends which are in juxtaposition with the ends of the channel region, the barrier region having such dimensions and composition that the barrier acts as a real space transfer media under a predetermined bias;
a third low resistance ohmic contact disposed between the first and second ohmic contacts on a surface of the device;
a split gate disposed between the first and third ohmic contacts on the surface of the device; and
biasing means connected to the device to create a voltage drop throughout the channel region;
wherein the single input gate is characterized as an ORNOR gate.

8. A single input logic gate comprising:
a channel region of high electrical conductance, the channel region comprising a modulation doped region and having at least two ends;
first and second low resistance ohmic contacts disposed at either end of the channel respectively, the first and second ohmic contacts penetrating the device from a top side of the device through to the channel region;
a barrier region disposed directly above the channel region, the barrier region having at least two ends which are in juxtaposition with the ends of the channel region, the barrier region having such dimensions and composition that the barrier acts as a real space transfer media under a predetermined bias;
a third low resistance ohmic contact disposed between the first and second ohmic contacts on a surface of the device;
a dual gate disposed between the first and third ohmic contacts on the surface of the device; and
biasing means connected to the device to create a voltage drop throughout the channel region;
wherein the single input logic gate is characterized as an ANDNAND gate.

* * * * *